(12) United States Patent
Hirose

(10) Patent No.: US 9,048,788 B2
(45) Date of Patent: Jun. 2, 2015

(54) SEMICONDUCTOR DEVICE COMPRISING A PHOTOELECTRIC CONVERSION PORTION

(75) Inventor: Atsushi Hirose, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 378 days.

(21) Appl. No.: 13/454,407

(22) Filed: Apr. 24, 2012

(65) Prior Publication Data
US 2012/0286143 A1 Nov. 15, 2012

(30) Foreign Application Priority Data

May 13, 2011 (JP) ................................ 2011-108737

(51) Int. Cl.
H03F 3/08 (2006.01)
(52) U.S. Cl.
CPC ........................................ H03F 3/082 (2013.01)
(58) Field of Classification Search
CPC ............................................................ H03F 3/08
USPC ........................................ 250/214 A, 214 R
See application file for complete search history.

(56) References Cited

U.S. PATENT DOCUMENTS

| | | |
|---|---|---|
| 5,698,844 A | 12/1997 | Shinohara et al. |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,765,374 B1 * | 7/2004 | Yang et al. .................... 323/280 |
| 6,960,817 B2 | 11/2005 | Ogura et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

Primary Examiner — Thanh Luu
(74) Attorney, Agent, or Firm — Eric J. Robinson; Robinson Intellectual Property Law Office, P.C.

(57) ABSTRACT

In a semiconductor device, power consumption is reduced. Further, a standby circuit is formed of a few elements, and thus increase in the circuit area of the semiconductor device is prevented. The standby circuit provided in the semiconductor device is formed of only one transistor and voltage supplied to the transistor is switched, whereby output current of the semiconductor device is controlled. As a result, the output current of the semiconductor device in a standby state can be substantially zero, so that the power consumption can be reduced. By using an oxide semiconductor for a semiconductor layer of a transistor, leakage current can be suppressed as low as possible.

24 Claims, 13 Drawing Sheets

(56) References Cited

U.S. PATENT DOCUMENTS

| | | |
|---|---|---|
| 7,211,825 B2 | 5/2007 | Shih et al |
| 7,253,391 B2 | 8/2007 | Koyama et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,495,272 B2 | 2/2009 | Maruyama et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,705,283 B2 | 4/2010 | Arao et al. |
| 7,732,819 B2 | 6/2010 | Akimoto et al. |
| 7,791,072 B2 | 9/2010 | Kumomi et al. |
| 7,932,126 B2 | 4/2011 | Maruyama et al. |
| 8,124,924 B2 | 2/2012 | Yanagisawa et al. |
| 8,263,926 B2 | 9/2012 | Arao et al. |
| 8,350,621 B2 | 1/2013 | Yamazaki et al. |
| 8,394,668 B2 * | 3/2013 | Seon et al. ............. 438/104 |
| 8,716,646 B2 | 5/2014 | Hirose |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0027372 A1 * | 1/2009 | Shishido et al. ............. 345/207 |
| 2009/0068773 A1 | 3/2009 | Lai et al. |
| 2009/0073325 A1 | 3/2009 | Kuwabara et al. |
| 2009/0101948 A1 | 4/2009 | Park et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0134735 A1 | 6/2010 | Nakamura et al. |
| 2011/0090006 A1 | 4/2011 | Yamazaki et al. |
| 2011/0108706 A1 | 5/2011 | Koyama |
| 2011/0157128 A1 | 6/2011 | Koyama |
| 2012/0104238 A1 | 5/2012 | Hirose |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-131324 | 5/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-136392 | 5/2005 |
| JP | 2010-153834 | 7/2010 |
| WO | WO-2004/114391 | 12/2004 |
| WO | WO 2006/051993 | 5/2006 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J at al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M at al., "Theoretical Analysis of IGZO Transparent Amorphous Oxide Semiconductor,", IDW '08 : Proceedings of the 15th International Display Workshops, Dec. 3, 2008, pp. 1637-1640.

(56) References Cited

OTHER PUBLICATIONS

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M at al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and (Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K at al., "Thin-Film Transistor Fabricated in Single-Crystalline Transparent Oxide Semiconductor,", Science, May 23, 2003, vol. 300, No. 5623, pp. 1269-1272.

Masuda.S at al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T at al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K at al., "Carrier transport in transparent oxide semiconductor with intrinsic structural randomness probed using single-crystalline InGaO3(ZnO)5 films,", Appl. Phys. Lett. (Applied Physics Letters) Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J at al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H at al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,"; SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

(56) References Cited

OTHER PUBLICATIONS

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, andYb2Fe3O7 Types of Structures for Compounds in the $In_2O_3$ and $Sc_2O_3$—$A_2O_3$—BO Systems [A; Fe, Ga, or Al; B: Mg, Mn, Fe, Ni, Cu,or Zn]at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies In ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide $InGaO_3(ZnO)m$ (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on $SrTiO_3$ With Sputtered $Al_2O_3$ Gate Insulator,", Appl. Phys. Lett. (Applied Physics Letters) , Sep. 1, 2003, vol. 83, No. 9, pp. 1755-1757.

\* cited by examiner

● In
◐ Sn
◡ Zn
• O

● In
● Ga
● Zn
● O

SEMICONDUCTOR DEVICE COMPRISING A PHOTOELECTRIC CONVERSION PORTION

BACKGROUND OF THE INVENTION

1. Field of the Invention

The present invention relates to a semiconductor device having a photoelectric conversion element, a manufacturing method and an operation method thereof.

In this specification, a semiconductor device generally means a device which can function by utilizing semiconductor characteristics, and an electrooptic device, a semiconductor circuit, and an electronic device are all semiconductor devices.

2. Description of the Related Art

A large number of semiconductor devices generally used for detecting electromagnetic waves are known, and for example, semiconductor devices having sensitivity to ultraviolet rays to infrared rays are referred to as optical sensors. A light sensor which has sensitivity to a visible light region with a wavelength of 400 nm to 700 nm is particularly referred to as a visible light sensor, and a large number of visible light sensors are used for devices which need illuminance adjustment, on/off control, or the like depending on a human living environment.

In particular, in a display device, ambient brightness is detected to adjust display luminance of the display device. This is because unnecessary power consumption can be reduced by detecting ambient brightness and obtaining appropriate display luminance. For example, such an optical sensor for adjusting display luminance is used for a cellular phone or a personal computer.

In addition, as well as ambient brightness, luminance of a back light of a display device, particularly, a liquid crystal display device is also detected by an optical sensor to adjust luminance of a display screen.

In such an optical sensor, a photodiode is used for a sensing part. A chip which has two terminals and is formed by combining an amplifier circuit including a transistor with a photodiode is disclosed in Patent Document 1.

Further, an optical sensor including an amplifier circuit formed of a transistor including an oxide semiconductor layer is disclosed in Patent Document 2.

REFERENCE

Patent Document

[Patent Document 1] Japanese Published Patent Application No. 2005-136392
[Patent Document 2] Japanese Published Patent Application No. 2010-153834

SUMMARY OF THE INVENTION

An optical sensor has been used for a wide range of electronic appliances typified by an imaging device and a display device. By incorporating an optical sensor in a portable information terminal such as a mobile phone or a game machine, power consumption is reduced or a display method of a display device is switched. In particular, a reduction in size for a reduction in weight of such a portable information terminal has been desired, and a reduction in power consumption of an optical sensor has also been desired in order to achieve a long-time operation in which a battery is used as a power supply.

Thus, an object of an embodiment of the present invention is to reduce power consumption of an optical sensor further.

In terms of reducing excessive power consumption, low power consumption of an optical sensor is achieved by providing a standby function with which unnecessary power supply is stopped.

One embodiment of the present invention disclosed in the specification is a semiconductor device including a photoelectric conversion portion including a photoelectric conversion element, a current amplifier circuit amplifying current generated in the photoelectric conversion element, and a standby circuit, wherein the photoelectric conversion portion includes a first terminal, a second terminal, and a third terminal, wherein a power supply voltage is supplied to the first terminal, wherein a resistor is electrically connected to the second terminal, and wherein the third terminal is electrically connected to the standby circuit.

In the above semiconductor device, the current amplifier circuit is preferably a current mirror circuit.

In the above semiconductor device, the standby circuit may include a transistor including an oxide semiconductor layer.

The above semiconductor device may also include a capacitor, and one terminal of the capacitor may be electrically connected to one terminal of the resistor.

In the above semiconductor device, the standby circuit may be electrically connected to the current amplifier circuit.

The current amplifier circuit is formed by combining a plurality of transistors including silicon. On the other hand, a transistor including an oxide semiconductor layer is preferably used for the standby circuit, and the standby circuit can be provided above the current amplifier circuit to overlap therewith. In that case, even when the standby circuit is provided, the size of the whole optical sensor is not changed so much.

Further, a transistor including an oxide semiconductor layer can be used as a transistor included in the current amplifier circuit. When a transistor including an oxide semiconductor layer is used, the standby circuit can be formed in the same process as the current amplifier circuit. Moreover, when transistors including an oxide semiconductor layer are used, there is less variation in electric characteristics between a plurality of transistors, so that a current amplifier circuit with little variation can be achieved. Variation in between current amplifier circuits of each product causes variation in electric characteristics of the product, which leads to reduction in yield, inconvenience, or the like.

Low power consumption of an optical sensor can be achieved by having a standby function.

DETAILED DESCRIPTION OF THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

Figure 1:
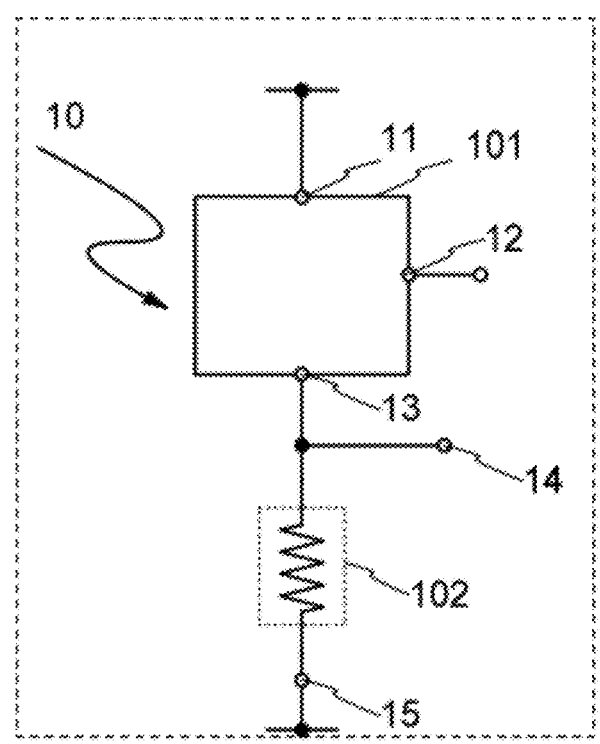
FIG. 1 illustrates a semiconductor device according to Embodiment 1.

First, a semiconductor device 100 of the present invention will be described with reference to FIG. 1. FIG. 1 is a circuit diagram illustrating a structural example of the semiconductor device 100 of the present invention. In this embodiment, a photoelectric conversion portion 101 in FIG. 1 includes at least one standby circuit which can control power consumption of the whole semiconductor device 100, one photoelectric conversion element which converts light energy into electrical energy, and one current amplifier circuit which amplifies a minute detection current generated in the photoelectric conversion element.

As illustrated in FIG. 1, the semiconductor device 100 in this embodiment includes the photoelectric conversion portion 101, a resistor 102, a first terminal 11, a second terminal 12, a third terminal 13, a fourth terminal 14, and a fifth terminal 15. A high power supply voltage (Vdd) is supplied to the first terminal 11, and a low power supply voltage (Vss) is supplied to the fifth terminal 15. Note that the photoelectric conversion portion 101 has a three-terminal structure which is provided with the first terminal 11, the second terminal 12, and the third terminal 13.

Next, the operation of the semiconductor device 100 illustrated in FIG. 1 is briefly described. When light 10 enters the photoelectric conversion portion 101, current is generated in the photoelectric conversion portion 101 in accordance with the intensity of the light 10. The current can be obtained as an output current $I_{OUT}$ from the third terminal 13. Further, the output current $I_{OUT}$ flows through the resistor 102. At this time, voltage is generated on both ends of the resistor 102. The voltage can be obtained as an output voltage $V_{OUT}$ from the fourth terminal 14. Therefore, the semiconductor device 100 can output the output current $I_{OUT}$ and the output voltage $V_{OUT}$ in accordance with the intensity of the light 10.

Figure 3:
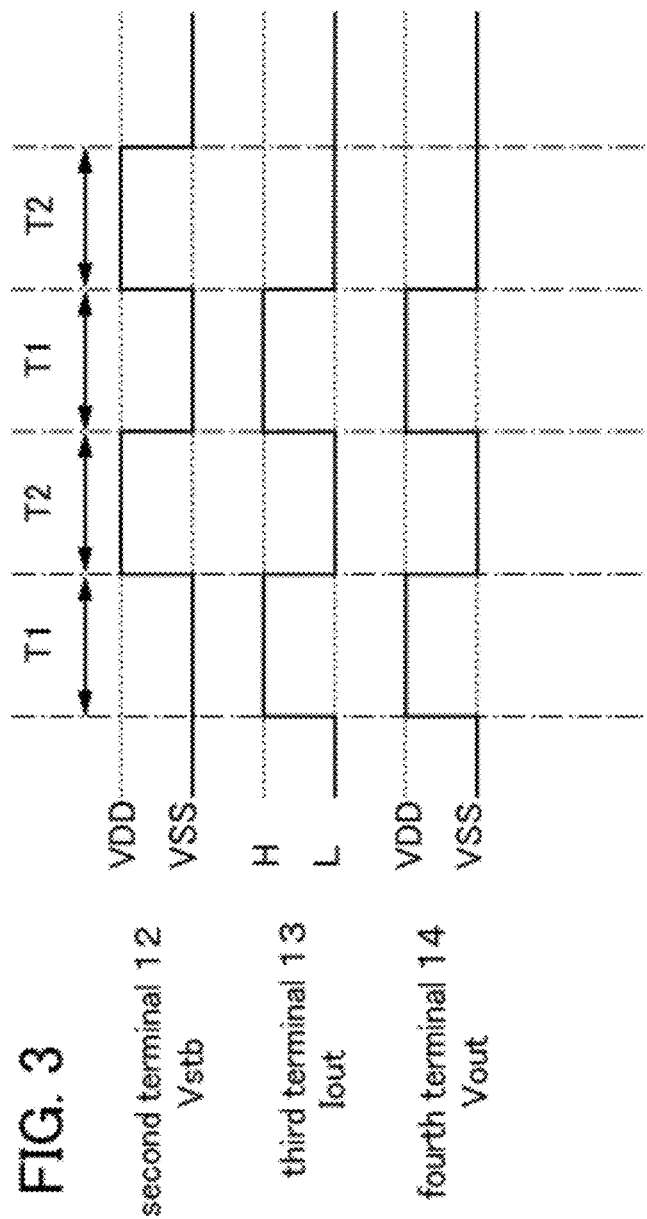
FIG. 3 is a timing chart of a semiconductor device according to Embodiment 1.

At this time, in the semiconductor device 100 according to one embodiment of the present invention, by switching voltage supplied to the second terminal 12, the obtained output current $I_{OUT}$ and output voltage $V_{OUT}$ are changed, so that power consumption of the semiconductor device 100 can be reduced. FIG. 3 schematically shows a chart illustrating the change of the output current $I_{OUT}$ and the output voltage $V_{OUT}$ which are outputted from the semiconductor device 100 illustrated in FIG. 1 when the voltage supplied to the second terminal 12 is switched in the semiconductor device 100.

A period T1 shows a normal operation state, and a period T2 shows a standby state. In the normal operation state (the period T1), the low power supply voltage (Vss) is supplied to the second terminal 12. At this time, a high current (so-called a desired current) is outputted from the third terminal 13, and a high power supply voltage (so-called a desired voltage) is outputted from the fourth terminal 14 in accordance with the output current $I_{OUT}$. On the other hand, in the standby state (the period T2), a high power supply voltage (Vdd) is supplied to the second terminal 12. At this time, a low current (so-called a substantially zero current) is outputted from the third terminal 13, and a low power supply voltage (so-called a substantially zero voltage) is outputted from the fourth terminal 14 in accordance with the output current $I_{OUT}$. Therefore, in the standby state in which the high power supply voltage (Vdd) is supplied to the second terminal 12, the output current $I_{OUT}$ and the output voltage $V_{OUT}$ become substantially zero, so that power consumption can be reduced. That is, by switching the voltage supplied to the second terminal 12, power consumption of the semiconductor device 100 can be controlled.

Next, an example of a specific circuit structure of the semiconductor device 100 will be described with reference to FIG. 2. The semiconductor device 100 illustrated in FIG. 2 includes a current mirror circuit 120, a photodiode 103, a standby circuit 116, the resistor 102, a capacitor 107, the first terminal 11, the second terminal 12, the third terminal 13, the fourth terminal 14, and the fifth terminal 15.

The current mirror circuit 120 is formed of one transistor 104 on a reference side and n transistors 105 (105_1 to 105_n) on a mirror side. Note that the reference side refers to a side in which a current flowing to a source terminal of a transistor is equal to a current flowing to a gate terminal of the transistor. The mirror side refers to a side in which a transistor outputting a current corresponding to a gate voltage generated on the reference side. The current mirror circuit 120 is a current amplifier circuit for amplifying a detection current of the photodiode 103. The photodiode 103 has a high resistance and the resistance value of the photodiode 103 becomes several kiloohms to several gigaohms, resulting in an extremely small detection current. Therefore, a current amplifier circuit like the current mirror circuit 120 is preferably used. In this embodiment, the current mirror circuit 120 is supplied to a current amplifier circuit; however, a current amplifier circuit is not limited thereto.

Figure 2:
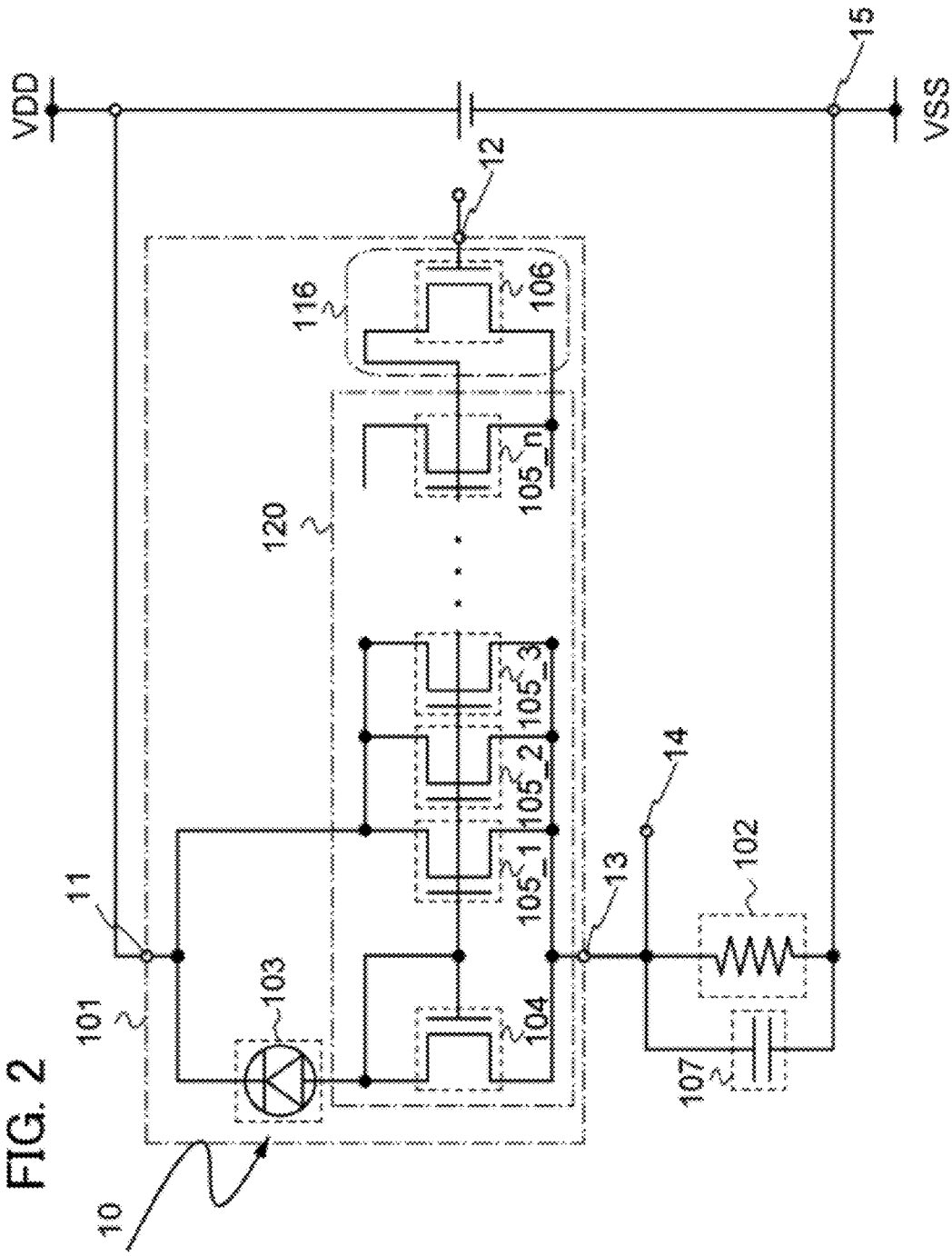
FIG. 2 illustrates a semiconductor device according to Embodiment 1.

The standby circuit 116 illustrated in FIG. 2 has a simple structure including only one transistor 106. The photoelectric conversion portion 101 has a three-terminal structure in which the first terminal 11, the terminal 12, and the third terminal 13 are provided. One terminal (the second terminal 12) of the three terminals is provided to control an operation of the standby circuit 116.

In this embodiment, the transistor 104, the transistors 105, and the transistor 106 are all n-channel transistors; however, these transistors are not limited thereto. The transistor 104, the transistors 105, and the transistor 106 may be all p-channel transistors.

One terminal of the photodiode 103, one terminal of a source and a drain of each of the n transistors 105 (105_1 to 105_n), and the first terminal 11 are electrically connected. The other terminal of the photodiode 103, one terminal of a source and a drain of the transistor 104, a gate terminal of the transistor 104, each gate terminal of the n transistors 105

(105_1 to 105__n), and one terminal of a source and a drain of the transistor 106 are electrically connected. A gate terminal of the transistor 106 and the second terminal 12 are electrically connected. The other terminal of the source and the drain of the transistor 104, the other terminals of the source and the drain of each of the n transistors 105 (105_1 to 105__n), the other terminal of the source and the drain of the transistor 106, and the third terminal 13 are electrically connected. The third terminal 13, one terminal of the resistor 102, one terminal of the capacitor 107, and the fourth terminal 14 are electrically connected. The other terminal of the resistor 102, the other terminal of the capacitor 107, and the fifth terminal 15 are electrically connected. The high power supply voltage (Vdd) is supplied to the first terminal 11, and the low power supply voltage (Vss) is supplied to the fifth terminal 15.

Figure 4:
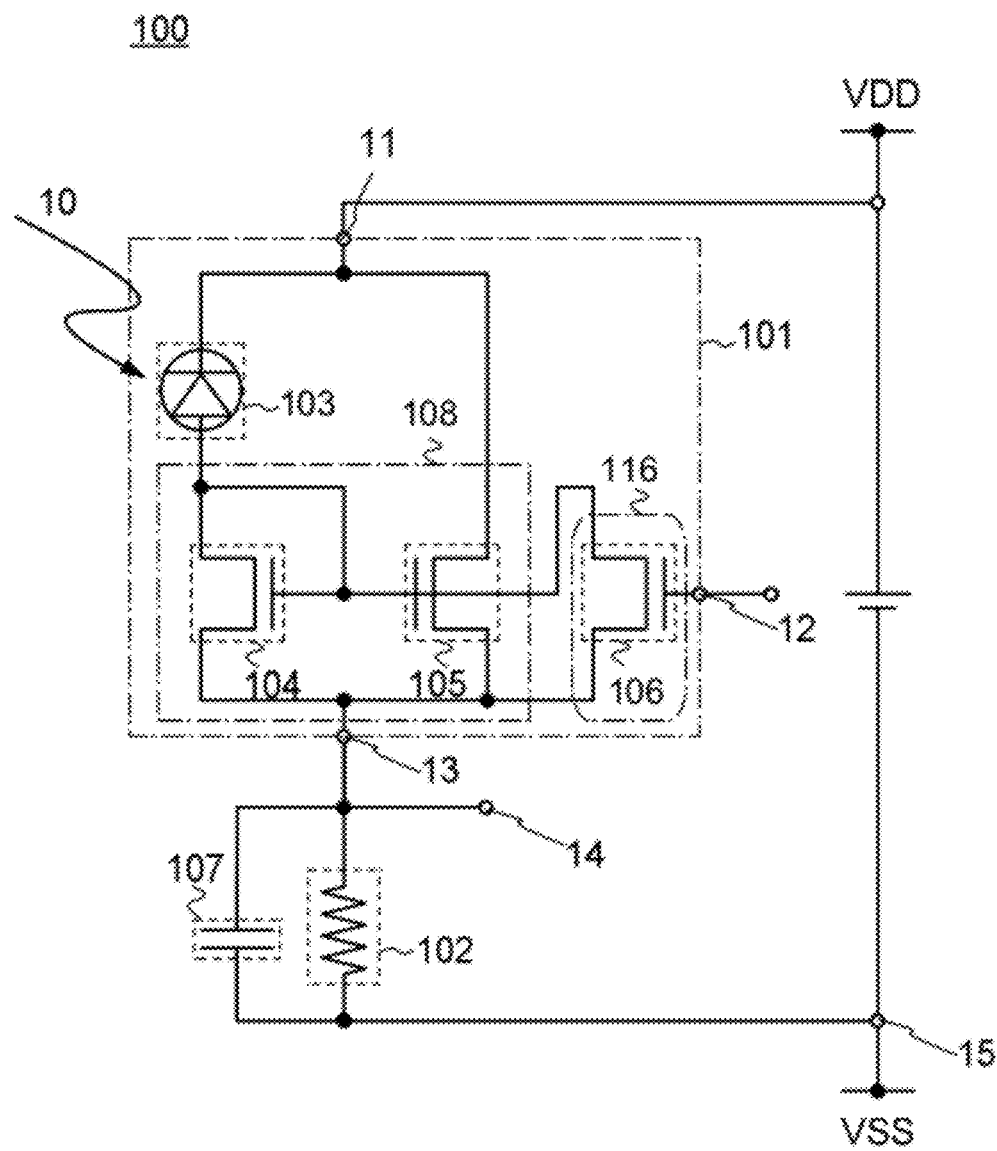
FIG. 4 illustrates a semiconductor device according to Embodiment 1.

In FIG. 2, an example of the current mirror circuit 120 formed of one transistor 104 on the reference side and n transistors 105 (105_1 to 105__n) on the mirror side, that is, n+1 transistors in total, is illustrated. In FIG. 4, an example of a current mirror circuit 108 formed of one transistor 104 on the reference side and one transistor 105 on the mirror side, that is, two transistors in total, is illustrated. However, one embodiment of the present invention is not limited thereto.

A current which flows between the source terminal and the drain terminal of the transistor 104 on the reference side is referred to as a reference current, and a current which flows between the source terminal and the drain terminal of the transistor 105 on the mirror side is referred to as a mirror current. As illustrated in FIG. 4, when there is one transistor 105 on the mirror side, a ratio of the reference current to the mirror current satisfies a relation of 1:1. (Note that the transistor 104 on the reference side and the transistor 105 on the mirror side have the same electric characteristics.) In this embodiment, the transistor 104 on the reference side and the transistors 105 (105_1 to 105__n) on the mirror side have the same electric characteristics.

An operation of the semiconductor device 100 illustrated in FIG. 2 will be described specifically with reference to FIG. 5 and FIG. 6. Note that an on state or an off state of each transistor and current flow are illustrated in FIG. 5 and FIG. 6.

Figure 5:
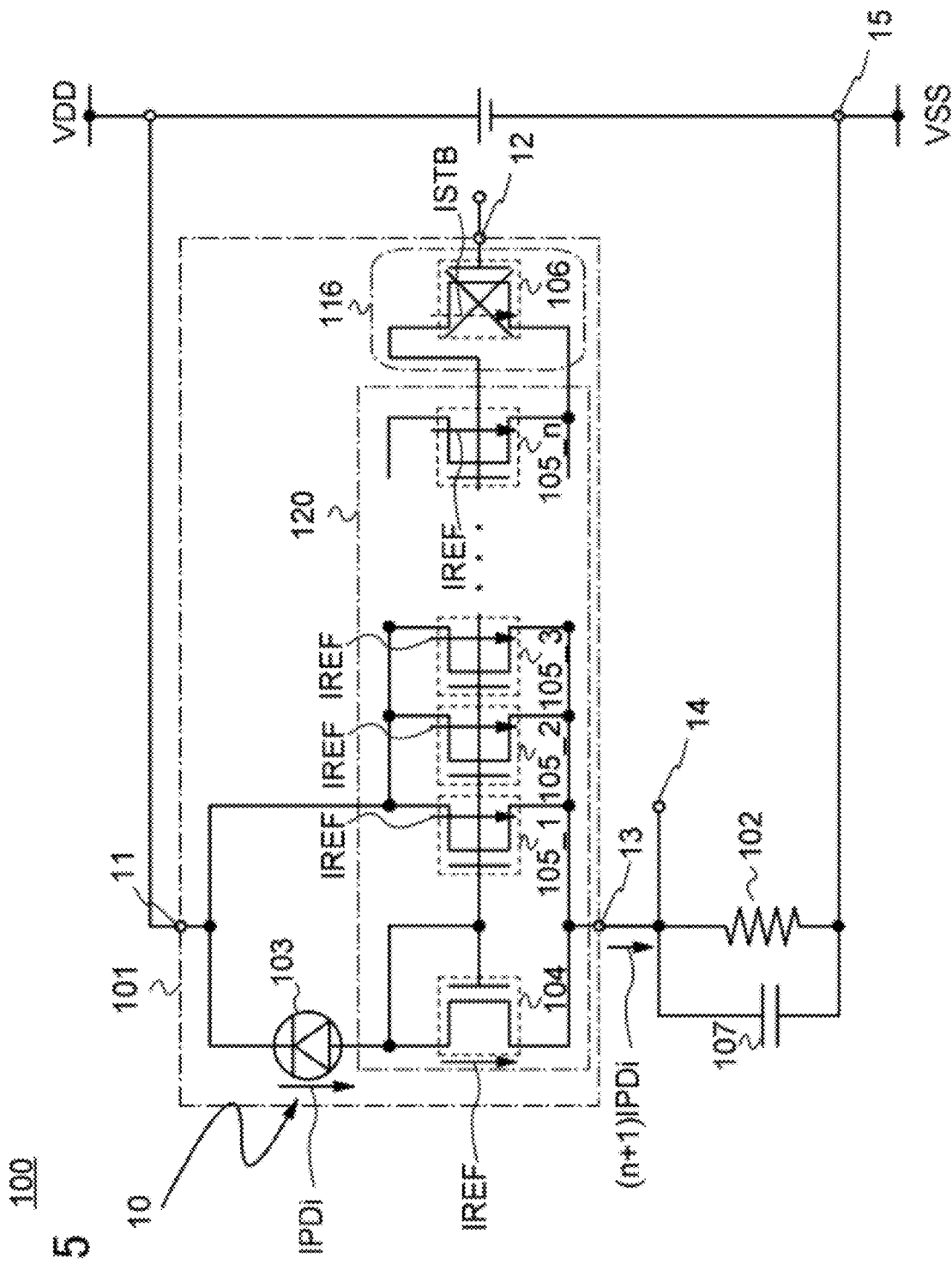
FIG. 5 illustrates a state of output current of a semiconductor device according to Embodiment 1.

<Normal Operation State (Period T1)> (See FIG. 5)

When the light 10 enters the photodiode 103, current is generated in the photodiode 103 in accordance with the intensity of the light 10, and the current is referred to as a detection current $I_{PDi}$ of the photodiode 103. Further, in a normal operation state (the period T1), a low power supply voltage (Vss) is supplied to the second terminal 12. At this time, the transistor 106 (nch) is turned off. Even when the transistor 106 is turned off, a slight amount of leakage current is generated, which is referred to as an output current $I_{STB}$ (the leakage current) of the standby circuit 116. Therefore, when current which flows through the transistor 104 on the reference side is referred to as a reference current $I_{REF}$, the reference current $I_{REF}$ can be expressed by a difference between the detection current $I_{PDi}$ and the output current $I_{STB}$ (a leakage current). The reference current $I_{REF}$ flows through the transistor 104 on the reference side, so that voltage $V_{GATE}$ is generated in the gate terminal of the transistor 104. The gate terminal of the transistor 104 on the reference side and each of the gate terminals of the transistors 105 (105_1 to 105__n) on the mirror side are electrically connected; therefore, the voltage $V_{GATE}$ is generated in each of the gate terminals of the transistors 105 (105_1 to 105__n) on the mirror side. Thus, when current which flows through each of the transistors 105 (105_1 to 105__n) on the mirror side is referred to as a mirror current $I_{mirror}$, the mirror current $I_{mirror}$ is equal to the reference current $I_{REF}$. (The transistor 104 on the reference side and the transistors 105 (105_1 to 105__n) on the mirror side have the same electric characteristic.) Therefore, the output current $I_{OUT}$ obtained from the third terminal 13 can be expressed by the product of the reference current $I_{REF}$ (mirror current $I_{mirror}$) and the total number of the transistors included in the current mirror circuit 120.

Figure 6:
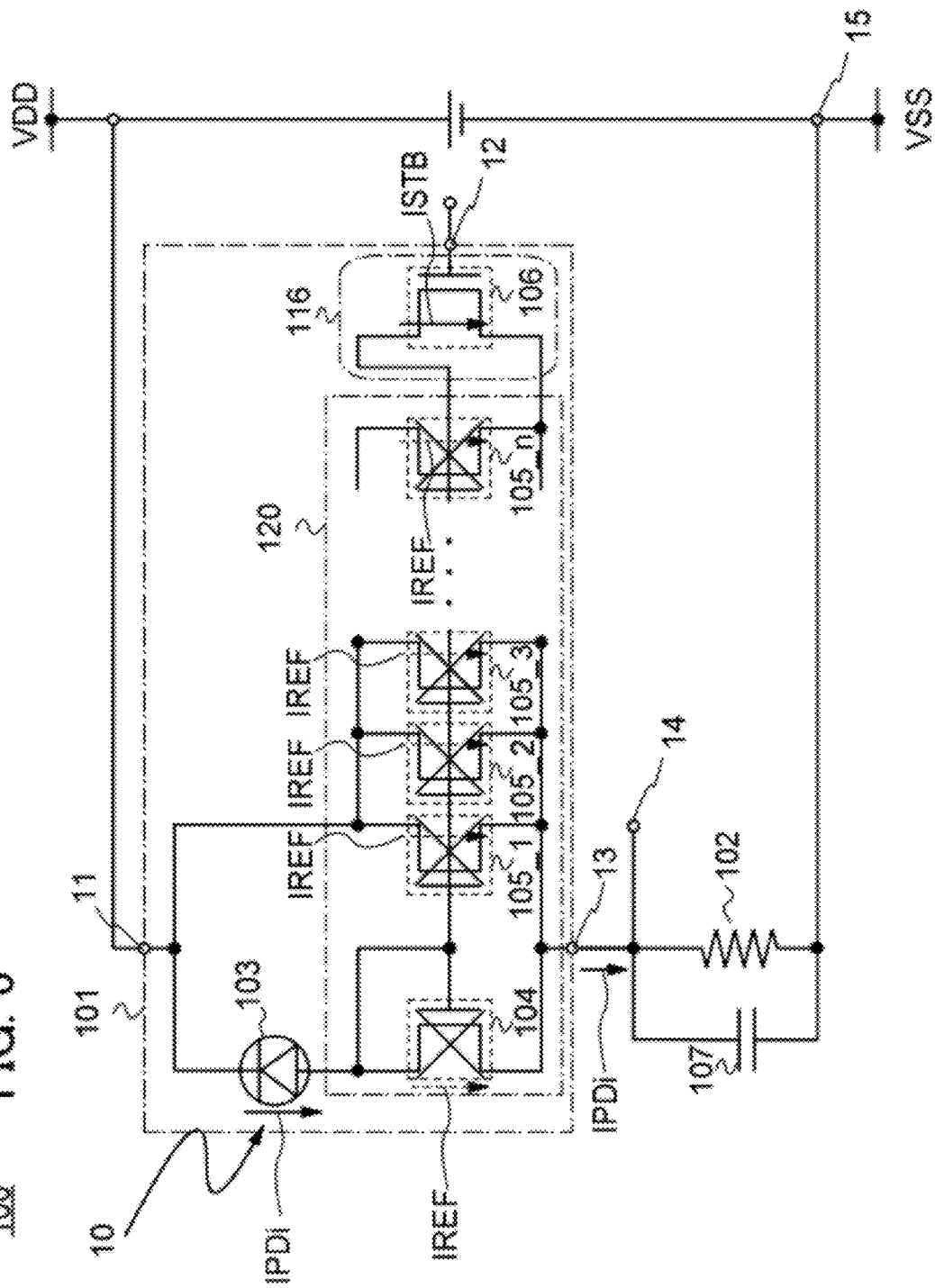
FIG. 6 illustrates a state of output current of a semiconductor device according to Embodiment 1.

In the current mirror circuit 120, the output current $I_{OUT}$ ((n+1) $I_{PDi}$ in FIG. 5, $I_{PDi}$ in FIG. 6) can be controlled in accordance with the number of the transistors on the mirror side. This is based on a principle similar to that of a configuration in which the channel width of a transistor is increased so as to raise the limit of the current that can flow through the transistor. The number of transistors on the mirror side which are connected in parallel may be determined in accordance with a desired output current $I_{OUT}$.

The output current $I_{OUT}$ outputted from the third terminal 13 flows through the resistor 102 and the capacitor 107 which are connected in parallel. At this time, voltage is generated on both ends of the resistor 102 and on both ends of the capacitor 107, and the generated voltage can be obtained as an output voltage $V_{OUT}$ from the fourth terminal 14. Therefore, the semiconductor device 100 can output the output current $I_{OUT}$ and the output voltage $V_{OUT}$ in accordance with the intensity of the light 10. Further, when the output current $I_{STB}$ (a leakage current) is presumed to be extremely close to zero, the reference current $I_{REF}$ flowing through the transistor 104 can be regarded as being equal to the detection current $I_{PD}$ of the photodiode 103. Therefore, the detection current $I_{PDi}$ can be obtained from the output current $I_{OUT}$.

The above description is formulated as Formula 1 below.

$$\begin{aligned}I_{OUT} &= \{I_{REF} \times (n+1)\} + I_{STB} \quad \text{[FORMULA 1]}\\ &= \{(I_{PDi} - I_{STB}) \times (n+1)\} + I_{STB}\\ &\approx I_{PDi} \times (n+1)\end{aligned}$$

<Standby State (Period T2)> (See FIG. 6)

When the light 10 enters the photodiode 103, current is generated in the photodiode 103 in accordance with the intensity of the light 10, and the current is referred to as a detection current $I_{PDi}$ of the photodiode 103. Further, in a standby state (the period T2), a high power supply voltage (Vdd) is supplied to the second terminal 12. At this time, the transistor 106 (nch) is turned on, and an output current $I_{STB}$ of the standby circuit 116 flows through the transistor 106. The transistor 106 is turned on, so that the detection current $I_{PDi}$ generated in the photodiode 103 flows through the transistor 106. That is, in the standby state (the period T2), the output current $I_{STB}$ of the standby circuit 116 is equal to the detection current $I_{PDi}$ generated in the photodiode 103. Note that the detection current $I_{PD}$ is significantly small.

At this time, the transistor 104 (nch) on the reference side is turned off. Even when the transistor 104 on the reference side is turned off, a slight amount of leakage current is generated, and the current is referred to as a reference current $I_{REF}$ (a leakage current). The transistor 104 on the reference side is in an off state, so that the voltage $V_{GATE}$ generated in the gate terminal of the transistor 104 on the reference side becomes the low power supply voltage (Vss). The gate terminal of the transistor 104 on the reference side and each of the gate terminals of the transistors 105 (105_1 to 105__n) on the mirror side are electrically connected; therefore, the voltage $V_{GATE}$ generated in each of the gate terminals of the transistors 105 (105_1 to 105__n) on the mirror side is also the low power supply voltage (Vss). As a result, each of the transistors 105 (105_1 to 105_n) on the mirror side is also turned off. Even when each of the transistors 105 (105_1 to 105_n) on the mirror side is turned off, a slight amount of leakage current flows therethrough, and the current is referred to as a mirror current $I_{mirror}$ (a leakage current). Note that the current mirror circuit 120 does not perform its function because the transistor 104 on the reference side and each of the transistors 105 (105_1 to 105_n) on the mirror side is in an off state.

Therefore, the output current $I_{OUT}$ obtained by the third terminal 13 can be expressed by the sum of the output current $I_{STB}$ and the product of the reference current $I_{REF}$ (a leakage current) (the mirror current $I_{mirror}$ (a leakage current)) and the transistors included in the current mirror circuit 120 in total. Note that the reference current $I_{REF}$ (a leakage current) and the mirror current $I_{mirror}$ (a leakage current) are extremely small. For example, when an oxide semiconductor is included in a transistor included in the current mirror circuit 120, the following relations are satisfied: the output current $I_{STB}$>>the reference current $I_{REF}$ (a leakage current), and the output current $I_{STB}$>>the mirror current $I_{mirror}$ (a leakage current).

The output current $I_{OUT}$ is obtained from the third terminal 13, so that the output current $I_{OUT}$ flows through the resistor 102 and the capacitor 107 which are connected in parallel. At this time, voltage is generated on both ends of the resistor 102 and on both ends of the capacitor 107, and the generated voltage can be obtained as an output voltage $V_{OUT}$ from the fourth terminal 14. Therefore, the output current $I_{OUT}$ and the output voltage $V_{OUT}$ can be obtained from the semiconductor device 100 in accordance with the intensity of the light 10. Further, when the reference current $I_{REF}$ (a leakage current) (the mirror current $I_{mirror}$ (a leakage current)) is presumed to be extremely close to zero, the output current $I_{OUT}$ of the semiconductor device 100 is equal to the detection current $I_{PDi}$ of the photodiode 103. Thus, the output current $I_{OUT}$ can be presumed to be significantly small and the output voltage $V_{OUT}$ is substantially zero.

Therefore, in the standby state where a high power supply voltage (Vdd) is supplied to the second terminal 12, the output current $I_{OUT}$ and the output voltage $V_{OUT}$ are substantially zero, whereby the power consumption can be reduced.

The following Formula 2 shows the above-described case.

$$I_{OUT} = I_{STB} + \{(n+1) \times I_{REF}\} \quad [\text{FORMULA 2}]$$
$$= I_{PDi} + \{(n+1) \times I_{REF}\}$$
$$\approx I_{PDi}(I_{STB} \gg I_{REF})$$

That is, the power consumption can be reduced in the semiconductor device 100 by switching the voltage supplied to the second terminal 12 as follows: the low power supply voltage (Vss) is supplied in the normal state (the period T1), and the high power supply voltage (Vdd) is supplied in the standby state (the period T2). A voltage supplied to the second terminal 12 can be controlled as appropriate because the voltage is determined by an external signal. Every time the voltage is controlled, the most appropriate signal is preferably supplied depending on the state of the semiconductor device 100.

Further, the standby circuit 116 has a simple structure including only one transistor 106. Therefore, by adding a small number of elements, the semiconductor device 100 can have lower power consumption.

This embodiment can be combined with any of the other embodiments in this specification as appropriate.

Embodiment 2

In this embodiment, an example of a transistor in which an In—Sn—Zn—O film is used as an oxide semiconductor film in Embodiment 1 will be described with reference to FIGS. 9A and 9B.

Figure 9A:
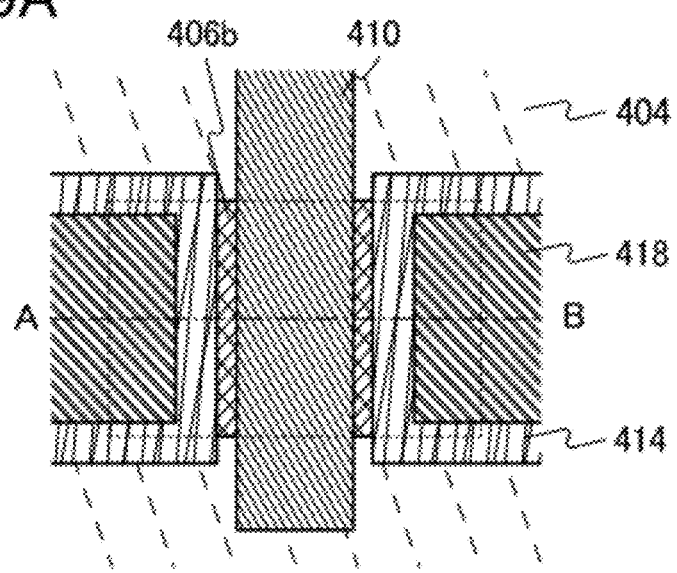
FIGS. 9A and 9B illustrate an example of a structure of a transistor.
Figure 9B:
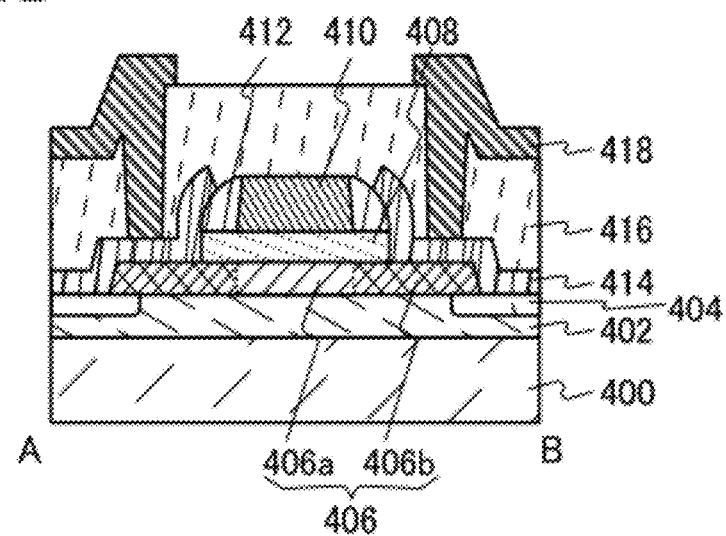

FIGS. 9A and 9B are a top view and a cross-sectional view of a coplanar transistor having a top-gate top-contact structure. FIG. 9A is the top view of the transistor. FIG. 9B illustrates cross section A-B along dashed-dotted line A-B in FIG. 9A.

Note that the light incident on the semiconductor device, in the transistor illustrated in FIGS. 9A and 9B, enters from only the substrate side.

The transistor illustrated in FIG. 9B includes a substrate 400; a base insulating film 402 provided over the substrate 400; a protective insulating film 404 provided in the periphery of the base insulating film 402; an oxide semiconductor film 406 provided over the base insulating film 402 and the protective insulating film 404 and including a high-resistance region 406a and low-resistance regions 406b; a gate insulating film 408 provided over the oxide semiconductor film 406; a gate electrode 410 provided to overlap with the oxide semiconductor film 406 with the gate insulating film 408 positioned therebetween; a sidewall insulating film 412 provided in contact with a side surface of the gate electrode 410; a pair of electrodes 414 provided in contact with at least the low-resistance regions 406b; an interlayer insulating film 416 provided to cover the oxide semiconductor film 406, the gate electrode 410, and the pair of electrodes 414; and a wiring 418 provided to be connected to the pair of electrodes 414 through an opening formed in the interlayer insulating film 416.

Although not illustrated, a protective film may be provided to cover the interlayer insulating film 416 and the wiring 418. With the protective film, a minute amount of leakage current generated by surface conduction of the interlayer insulating film 416 can be reduced and thus the off-state current of the transistor can be reduced.

Next, another example of a transistor in which an In—Sn—Zn—O film is used as an oxide semiconductor film will be described with reference to FIGS. 10A and 10B.

Figure 10A:
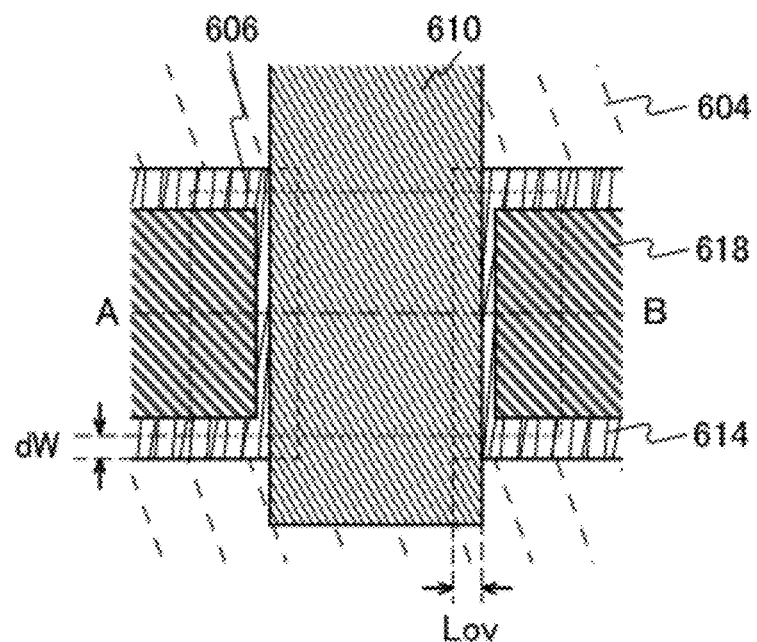
FIGS. 10A and 10B illustrate an example of a structure of a transistor.
Figure 10B:
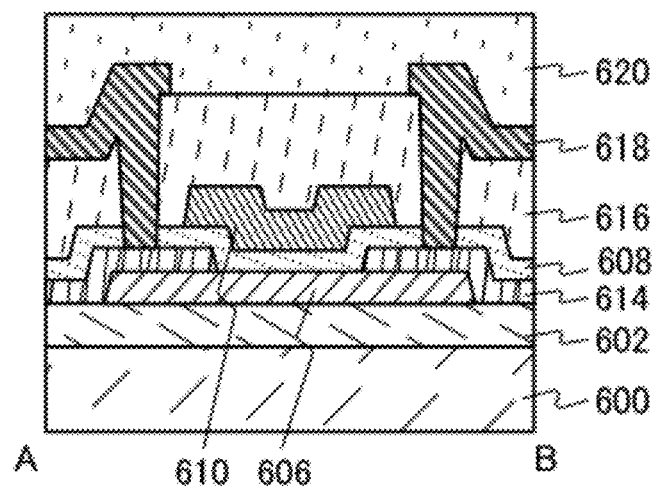

FIGS. 10A and 10B are a top view and a cross-sectional view of a transistor having a top-gate top-contact structure. FIG. 10A is the top view of the transistor. FIG. 10B illustrates cross section A-B along dashed-dotted line A-B in FIG. 10A.

Note that the light incident on the semiconductor device, in the transistor illustrated in FIGS. 10A and 10B, enters from only the substrate side.

The transistor illustrated in FIG. 10B includes a substrate 600; a base insulating film 602 provided over the substrate 600; an oxide semiconductor film 606 provided over the base insulating film 602; a pair of electrodes 614 in contact with the oxide semiconductor film 606; a gate insulating film 608 provided over the oxide semiconductor film 606 and the pair of electrodes 614; a gate electrode 610 provided to overlap with the oxide semiconductor film 606 with the gate insulating film 608 positioned therebetween; an interlayer insulating film 616 provided to cover the gate insulating film 608 and the gate electrode 610; wirings 618 electrically connected to the pair of electrodes 614 through openings formed in the gate insulating film 608 and the interlayer insulating film 616; and a protective film 620 provided to cover the interlayer insulating film 616 and the wirings 618.

As the substrate 600, a glass substrate was used. As the base insulating film 602, a silicon oxide film was used. As the oxide semiconductor film 606, an In—Sn—Zn—O film was used. As the pair of electrodes 614, a tungsten film was used. As the gate insulating film 608, a silicon oxide film was used. As the gate electrode 610, a layered structure of a tantalum nitride film and a tungsten film was used. As the interlayer insulating film 616, a layered structure of a silicon oxynitride film and a polyimide film was used. As the wirings 618, a layered structure in which a titanium film, an aluminum film, and a titanium film are formed in this order was used. As the protective film 620, a polyimide film was used.

Note that in the transistor having the structure illustrated in FIG. 10A, the width of a portion where the gate electrode 610 overlaps with one of the pair of electrodes 614 is referred to as Lov. Similarly, the width of a portion of the pair of electrodes 614, which does not overlap with the oxide semiconductor film 606, is referred to as dW.

An example in which an oxide semiconductor In—Sn—Zn—O is used as the semiconductor in the above-described transistor is shown; however, the semiconductor is not limited to the material.

An oxide semiconductor to be used preferably contains at least indium (In) or zinc (Zn). In particular, In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn—O-based oxide" means an oxide containing In, Ga, and Zn as its main component and there is no particular limitation on the ratio of In:Ga:Zn. The In—Ga—Zn-based oxide may contain a metal element other than the In, Ga, and Zn.

Alternatively, as an oxide semiconductor, a material represented by $InMO_3(ZnO)_m$ (m>0 is satisfied, and m is not an integer) may be used. Note that M represents one or more metal elements selected from Ga, Fe, Mn, and Co. Alternatively, as the oxide semiconductor, a material represented by $In_3SnO_5(ZnO)_n$ (n>0, and n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

In an oxide semiconductor having crystallinity, when the surface flatness is improved, a higher mobility can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, or more preferably less than or equal to 0.1 nm.

Note that, $R_a$ is obtained by three-dimension expansion of center line average roughness that is defined by JIS B 0601 so as to be applied to a plane. The $R_a$ can be expressed as an "average value of the absolute values of deviations from a reference surface to a specific surface" and is defined by the formula below.

$$Ra = \frac{1}{S_0} \int_{y_1}^{y_2} \int_{x_1}^{x_2} |f(x, y) - Z_0| dx dy \qquad \text{[FORMULA 3]}$$

In the above formula, $S_0$ represents an area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. Ra can be measured using an atomic force microscope (AFM).

Hereinafter, an oxide having crystallinity will be described. Specifically, as the oxide semiconductor, an oxide including a crystal with c-axis alignment (also referred to as C-Axis Aligned Crystal (CAAC)), which has a triangular or hexagonal atomic arrangement when seen from the direction of an a-b plane, a surface, or an interface will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not single crystal, but this does not mean that the CAAC is composed of only an amorphous component. Although the CAAC includes a crystallized portion (crystalline portion), a boundary between one crystalline portion and another crystalline portion may not be clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 11A to 11E, FIGS. 12A to 12C, and FIGS. 13A to 13C. In FIGS. 11A to 11E, FIGS. 12A to 12C, and FIGS. 13A to 13C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 11A to 11E, O surrounded by a circle represents tetracoordinate O and O surrounded by a double circle represents tricoordinate O.

Figure 11A:
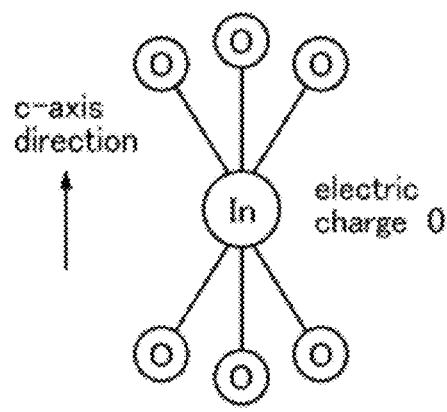
FIGS. 11A to 11E each illustrate a structure of an oxide material according to one embodiment of the present invention.

FIG. 11A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 11A is actually an octahedral structure, but is illustrated as a planar structure for simplicity. Note that three tetracoordinate O atoms exist in each of an upper half and a lower half in FIG. 11A. In the small group illustrated in FIG. 11A, electric charge is 0.

Figure 11D:
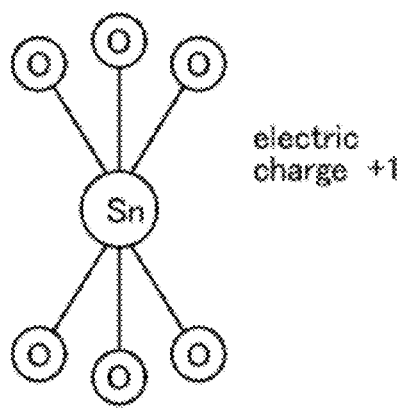
Figure 11B:
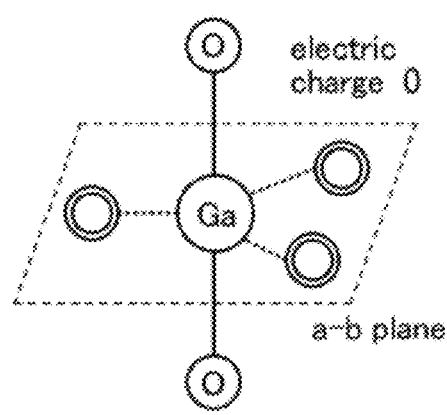

FIG. 11B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 11B. An In atom can also have the structure illustrated in FIG. 11B because an In atom can have five ligands. In the small group illustrated in FIG. 11B, electric charge is 0.

Figure 11E:
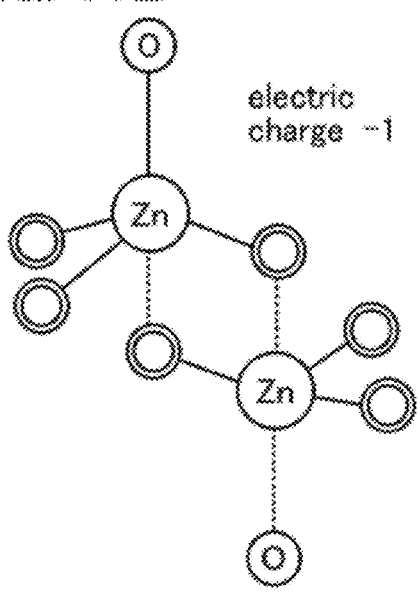
Figure 11C:
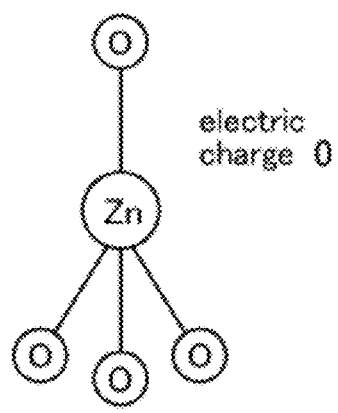

FIG. 11C illustrates a structure including one tetracoordinate Zn atom and four tetracoordinate O atoms proximate to the Zn atom. In FIG. 11C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 11C. In the small group illustrated in FIG. 11C, electric charge is 0.

FIG. 11D illustrates a structure including one hexacoordinate Sn atom and six tetracoordinate O atoms proximate to the Sn atom. In FIG. 11D, three tetracoordinate O atoms exist in each of an upper half and a lower half. In the small group illustrated in FIG. 11D, electric charge is +1.

FIG. 11E illustrates a small group including two Zn atoms. In FIG. 11E, one tetracoordinate O atom exists in each of an upper half and a lower half. In the small group illustrated in FIG. 11E, electric charge is −1.

Here, a plurality of small groups form a medium group, and a plurality of medium groups form a large group (also referred to as a unit cell).

Now, a rule of bonding between the subunits will be described. The three O atoms in the upper half with respect to the hexacoordinate In atom in FIG. 11A each have three proximate In atoms in the downward direction, and the three O atoms in the lower half each have three proximate In atoms in the upward direction. The one O atom in the upper half with respect to the pentacoordinate Ga atom in FIG. 11B has one proximate Ga atom in the downward direction, and the one O atom in the lower half has one proximate Ga atom in the upward direction. The one O atom in the upper half with respect to the tetracoordinate Zn atom in FIG. 11C has one proximate Zn atom in the downward direction, and the three O atoms in the lower half each have three proximate Zn atoms in the upward direction. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of subunits including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 12A:
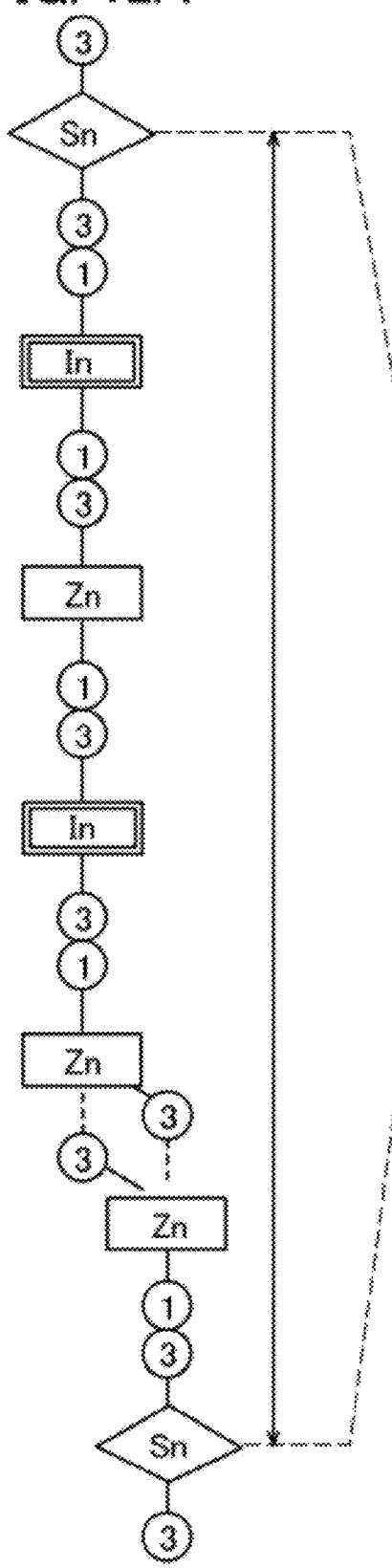
FIGS. 12A to 12C illustrate a structure of an oxide material according to one embodiment of the present invention.
Figure 12B:
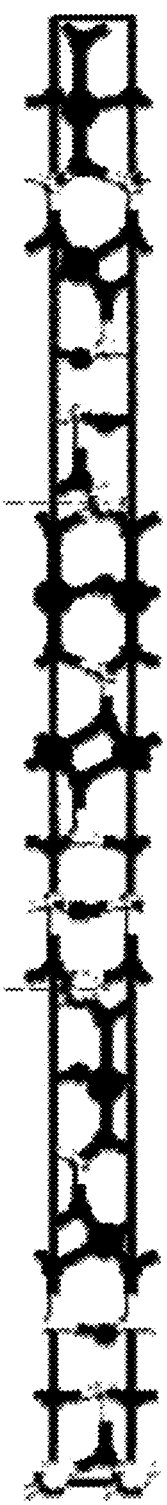
Figure 12C:
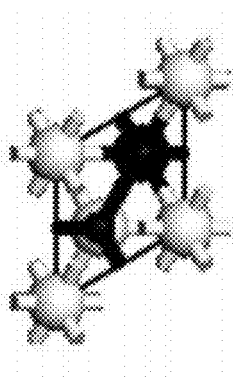

FIG. 12A illustrates a model of a medium group included in a layered structure of an In—Sn—Zn—O-based material. FIG. 12B illustrates a large group including three medium groups. Note that FIG. 12C illustrates an atomic arrangement in the case where the layered structure in FIG. 12B is observed from the c-axis direction.

In FIG. 12A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 12A, one tetracoordinate O atom existing in each of an upper half and a lower half with respect to an In atom is denoted by circled 1. FIG. 12A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 12A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 11E can be given. For example, with one small group including two Zn atoms, electric charge of one small group including a Sn atom can be cancelled, so that the total electric charge of the layered structure can be 0.

When the large group illustrated in FIG. 12B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

Figure 13A:
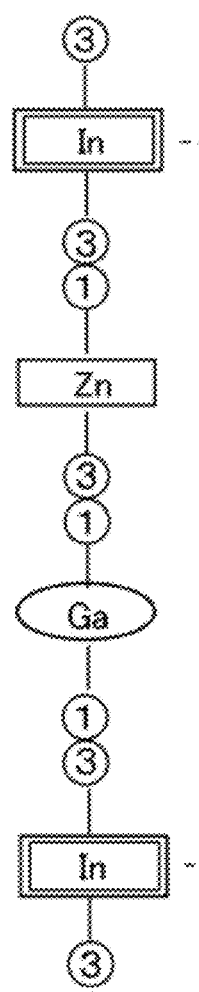
FIGS. 13A to 13C illustrate a structure of an oxide material according to one embodiment of the present invention.

As an example, FIG. 13A illustrates a model of a medium group included in a layered structure of an In—Ga—Zn—O-based material.

In the medium group included in the layered structure of the In—Ga—Zn—O-based material in FIG. 13A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 13B:
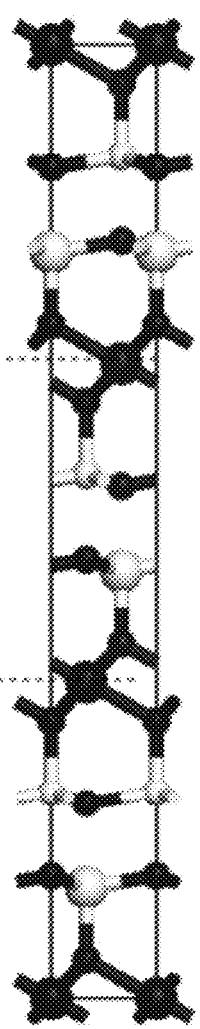
Figure 13C:
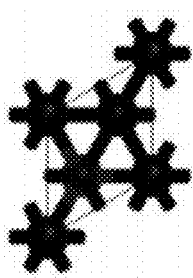

FIG. 13B illustrates a large group including three medium groups. Note that FIG. 13C illustrates an atomic arrangement in the case where the layered structure in FIG. 13B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 13A but also a medium group in which the arrangement of the In atom, the Ga atom, and the Zn atom is different from that in FIG. 13A.

Further, an In—Sn—Zn-based oxide can be referred to as ITZO (registered trademark), and as a target, an oxide target having a composition ratio of In:Sn:Zn=1:2:2, 2:1:3, 1:1:1, 20:45:35, or the like in an atomic ratio is used.

An embodiment of the present invention including the above-described structures will be described in more detail in examples below.

Example 1

In this example, it will be specifically verified by calculation that the voltage supplied to the standby circuit is switched between the normal state and the standby state, whereby the power consumption can be reduced.

Figure 7:
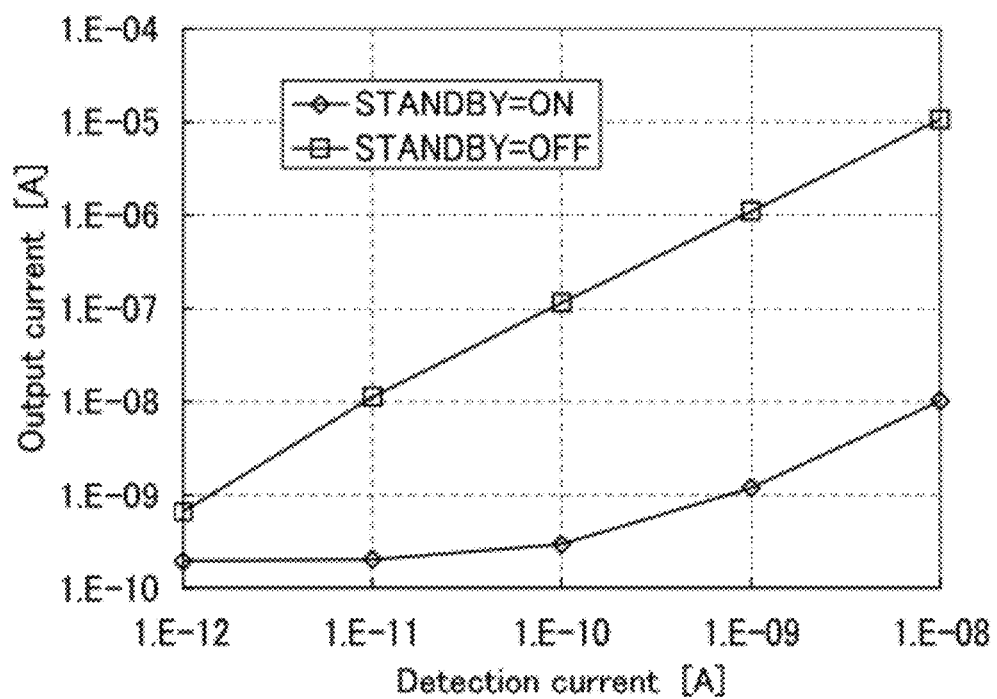
FIG. 7 shows calculation results of output current of a semiconductor device.

A current characteristic of the semiconductor device is shown in FIG. 7. A vertical axis indicates output current $I_{OUT}$ (A) and a horizontal axis indicates detection current $I_{PDi}$ (A) of a photodiode. In FIG. 2, one n-channel transistor (a channel size L/W=5 μm/5 μm) on the reference side and 1000 n-channel transistors (a channel size L/W=5 μm/5 μm) on the mirror side are provided. Moreover, one n-channel transistor (a channel size L/W=5 μm/50 μm) is included in the standby circuit. Note that the material of the semiconductor layers of these n-channel transistors includes an oxide semiconductor. The calculation is performed under the following condition: the voltage of a high power supply voltage (Vdd) is 5 V, the voltage of a low power supply voltage (Vss) is 0 V, the resistance of the resistor is 300 KΩ, and the capacitance of the capacitor is 0.022 μF.

In the semiconductor device according to one embodiment of the present invention illustrated in FIG. 2 (the semiconductor device in which the power consumption is reduced by providing the standby circuit), when the detection current $I_{PDi}$ (A) of a photodiode is $1.0 \times 10^{-8}$ A, the output current $I_{OUT}$ (A) is $1.0 \times 10^{-5}$ A in the normal state (the period T1), and the output current $I_{OUT}$ (A) is $1.02 \times 10^{-8}$ A in the standby state (the period T2). When the detection current $I_{PDi}$ (A) of the photodiode is $1.0 \times 10^{-12}$ A, the output current $I_{OUT}$ (A) is $6.59 \times 10^{-10}$ A in the normal state (the period T1), and the output current $I_{OUT}$ (A) is $1.94 \times 10^{-10}$ A in the standby state (the period T2).

FIG. 7 shows that the output current $I_{OUT}$(A) in the standby state is extremely small. FIG. 7 also shows, regardless of the value of the detection current $I_{PDi}$ (A) of the photodiode, there is a difference between the values of the output current $I_{OUT}$ (A) in the standby state and the output current $I_{OUT}$ (A) in the normal state, and the value of the output current $I_{OUT}$ in the standby state is much less than the value of the output current $I_{OUT}$ in the normal state. The results indicate that provision of a standby circuit in a semiconductor device enables a reduction in power consumption.

Figure 8:
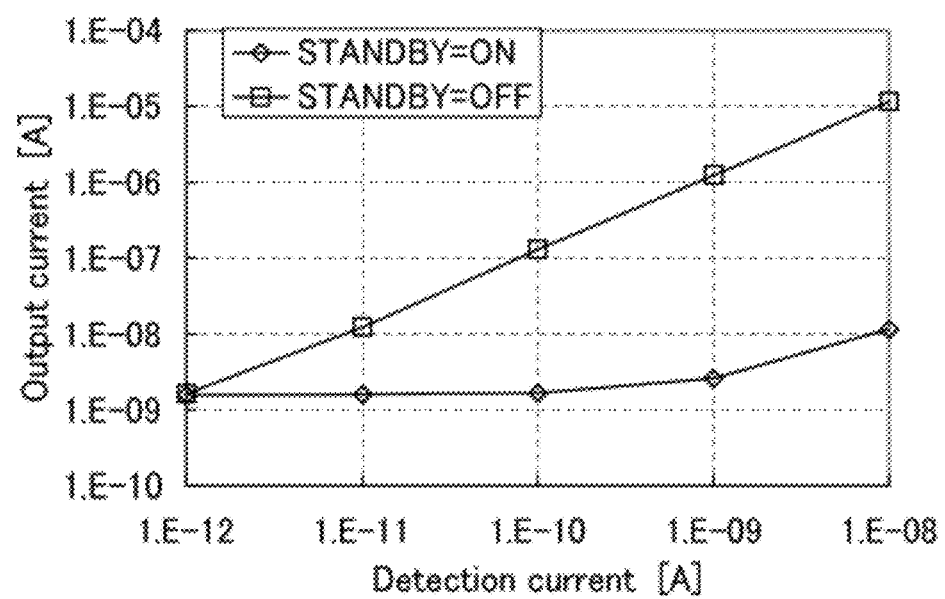
FIG. 8 shows calculation results of output current of a semiconductor device.

A current characteristic of the semiconductor device is shown in FIG. 8. A vertical axis indicates output current $I_{OUT}$ (A) and a horizontal axis indicates detection current $I_{PDi}$ (A) of a photodiode. In FIG. 2, one n-channel transistor (a channel size L/W=5 μm/5 μm) on the reference side and one thousand n-channel transistors (a channel size L/W=5 μm/5 μm) on the mirror side are provided. Moreover, one n-channel transistor (a channel size L/W=5 μm/50 μm) is included in the standby circuit. Note that the material of the semiconductor layers of these n-channel transistors includes a polysilicon. The calculation is performed under the following condition: the voltage of a high power supply voltage (Vdd) is 5 V, the voltage of a low power supply voltage (Vss) is 0 V, the resistance of the resistor is 300 kΩ, and the capacitance of the capacitor is 0.022 μF.

In the semiconductor device according to one embodiment of the present invention illustrated in FIG. 2 (the semiconductor device in which the power consumption is reduced by providing the standby circuit), when the detection current $I_{PDi}$ (A) of a photodiode is $1.0 \times 10^{-8}$ A, the output current $I_{OUT}$ (A) is $1.16 \times 10^{-5}$ A in the normal state (the period T1), and the output current $I_{OUT}$ (A) is $1.16 \times 10^{-8}$ A in the standby state (the period T2). When the detection current $I_{PDi}$ (A) of the photodiode is $1.0 \times 10^{-12}$ A, the output current $I_{OUT}$ (A) is $1.66 \times 10^{-9}$ A in the normal state (the period T1), and the output current $I_{OUT}$ (A) is $1.66 \times 10^{-9}$ A in the standby state (the period T2).

FIG. 8 shows that there is little difference in the output current $I_{OUT}$ between in the normal state and in the standby state when the value of the detection current $I_{PDi}$ (A) of the photodiode is low. However, FIG. 8 shows that the value of the output current $I_{OUT}$ in the standby state is much lower than that in the normal state when the value of the detection current $I_{PDi}$ (A) of the photodiode is high. Thus, by providing a standby circuit with a semiconductor device, it indicates that the power consumption of the semiconductor device can be reduced.

Note that FIG. 7 and FIG. 8 show that the semiconductor device including the n-channel transistor whose semiconductor layer is formed of an oxide semiconductor is suitable for when the value of the detection current $I_{PDi}$ (A) of the photodiode is low, for a so-called use for low illuminance, and the semiconductor device including the polysilicon as a material of the semiconductor layer of the n-channel transistor is suitable for when the value of the detection current $I_{PDi}$ (A) of the photodiode is high, for a so-called use for high illuminance.

This embodiment can be combined with any of the other embodiments in this specification as appropriate.

This application is based on Japanese Patent Application serial no. 2011-108737 filed with Japan Patent Office on May 13, 2011, the entire contents of which are hereby incorporated by reference.

What is claimed is:

1. A semiconductor device comprising a photoelectric conversion portion comprising:
    a first terminal;
    a second terminal;
    a third terminal;
    a photoelectric conversion element electrically connected to the first terminal;
    a standby circuit including a first transistor comprising an oxide semiconductor layer; and
    a current amplifier circuit comprising a second transistor electrically connected to the photoelectric conversion element, the current amplifier circuit being configured to amplify a current generated in the photoelectric conversion element;
  wherein:
    a gate of the first transistor is electrically connected to the second terminal;
    one terminal of a resistor is electrically connected to the third terminal;
    one of a source and a drain of the second transistor is electrically connected to a gate of the second transistor;
    one of a source and a drain of the first transistor is electrically connected to the photoelectric conversion element and the gate of the second transistor; and
    the other of the source and the drain of the first transistor and the other of the source and the drain of the second transistor are electrically connected to the third terminal.

2. The semiconductor device according to claim 1, wherein:
    the first terminal is configured to supply a first power supply voltage to the photoelectric conversion element; and
    the second terminal is configured to supply a second power supply voltage to the first transistor.

3. The semiconductor device according to claim 1, further comprising a capacitor,
    wherein one terminal of the capacitor is electrically connected to the one terminal of the resistor.

4. The semiconductor device according to claim 1, wherein the standby circuit is electrically connected to the current amplifier circuit.

5. The semiconductor device according to claim 1, wherein the oxide semiconductor layer contains one of indium and zinc.

6. The semiconductor device according to claim 1, wherein the oxide semiconductor layer contains indium and zinc.

7. The semiconductor device according to claim 6, wherein the oxide semiconductor layer contains gallium.

8. The semiconductor device according to claim 6, wherein the oxide semiconductor layer contains tin.

9. A display device comprising the semiconductor device according to claim 1.

10. An electronic device comprising the semiconductor device according to claim 1.

11. The semiconductor device according to claim 1, wherein one terminal of the photoelectric conversion element is electrically connected to the first terminal and the other terminal of the photoelectric conversion element is electrically connected to the one of the source and the drain of the second transistor.

12. The semiconductor device according to claim 1, wherein the third terminal is between the other of the source and the drain of the second transistor and the resistor.

13. A semiconductor device comprising a photoelectric conversion portion comprising:
    a first terminal;
    a second terminal;
    a third terminal;
    a photoelectric conversion element electrically connected to the first terminal;
    a standby circuit including a first transistor comprising an oxide semiconductor layer; and
    a current mirror circuit comprising a second transistor and a third transistor electrically connected to the photoelectric conversion element, the current mirror circuit being configured to amplify a current generated in the photoelectric conversion element;
  wherein:
    a gate of the first transistor is electrically connected to the second terminal;
    one terminal of a resistor is electrically connected to the third terminal;
    one of a source and a drain of the second transistor is electrically connected to a gate of the second transistor and a gate of the third transistor;

one of a source and a drain of the first transistor is electrically connected to the photoelectric conversion element, the gate of the second transistor and the gate of the third transistor; and the other of the source and the drain of the first transistor and the other of the source and the drain of the second transistor are electrically connected to the third terminal.

14. The semiconductor device according to claim 13, wherein:

the first terminal is configured to supply a first power supply voltage to the photoelectric conversion element; and the second terminal is configured to supply a second power supply voltage to the first transistor.

15. The semiconductor device according to claim 13, further comprising a capacitor, wherein one terminal of the capacitor is electrically connected to the one terminal of the resistor.

16. The semiconductor device according to claim 13, wherein the oxide semiconductor layer contains one of indium and zinc.

17. The semiconductor device according to claim 13, wherein the oxide semiconductor layer contains indium and zinc.

18. The semiconductor device according to claim 17, wherein the oxide semiconductor layer contains gallium.

19. The semiconductor device according to claim 17, wherein the oxide semiconductor layer contains tin.

20. A display device comprising the semiconductor device according to claim 13.

21. An electronic device comprising the semiconductor device according to claim 13.

22. The semiconductor device according to claim 13, wherein one terminal of the photoelectric conversion element is electrically connected to the first terminal and the other terminal of the photoelectric conversion element is electrically connected to the one of the source and the drain of the second transistor.

23. The semiconductor device according to claim 13, wherein the third terminal is between the other of the source and the drain of the second transistor and the resistor.

24. The semiconductor device according to claim 13, wherein one of a source and a drain of the third transistor is electrically connected to the first terminal and the other of the source and the drain of the third transistor is electrically connected to the other of the source and the drain of the second transistor and the third terminal.

\* \* \* \* \*